(12) United States Patent
Choi

(10) Patent No.: US 6,444,479 B1
(45) Date of Patent: Sep. 3, 2002

(54) METHOD FOR FORMING CAPACITOR OF SEMICONDUCTOR DEVICE

(75) Inventor: Hyung Bok Choi, Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/904,095

(22) Filed: Jul. 13, 2001

(30) Foreign Application Priority Data

Apr. 18, 2001 (KR) .......................................... 01-20740

(51) Int. Cl.[7] .............................................. H01L 21/00
(52) U.S. Cl. .......................................... 438/3; 438/240
(58) Field of Search ............................ 438/3, 240, 253, 438/396, 745, 754

(56) References Cited

U.S. PATENT DOCUMENTS

| | | |
|---|---|---|
| 5,380,673 A | 1/1995 | Yang et al. |
| 5,515,984 A * | 5/1996 | Yokoyama et al. ............ 216/41 |
| 5,652,171 A * | 7/1997 | Nagano et al. ................ 438/3 |
| 5,899,725 A | 5/1999 | Harshfield et al. |
| 6,100,100 A * | 8/2000 | Nagano et al. ................ 438/3 |
| 6,140,693 A | 10/2000 | Weng et al. |
| 6,331,442 B1 * | 12/2001 | New ........................... 438/240 |

* cited by examiner

Primary Examiner—Tuan H. Nguyen
(74) Attorney, Agent, or Firm—Morgan, Lewis & Bockius, LLP

(57) ABSTRACT

A method for forming a capacitor of a semiconductor device prevents characteristic of a device from being deteriorated due to residue resulting from a process step of defining a storage node. The method for forming a capacitor of a semiconductor device includes the steps of forming an insulating film having a contact hole on a substrate, forming a conductive layer within the contact hole, forming a first metal layer on an entire surface including the conductive layer, forming a dummy pattern and an etching barrier film on the first metal layer, selectively etching the dummy pattern and the etching barrier film to form a lower electrode formation region, forming a second metal layer in the lower electrode formation region using the first metal layer as a seed layer, removing the etching barrier film and the dummy pattern and performing a wet cleaning process to remove residue resulting from removing the etching barrier film and the dummy pattern, and removing the exposed first metal layer to form a lower electrode.

20 Claims, 7 Drawing Sheets residue generated during SiON etch-back process

METHOD FOR FORMING CAPACITOR OF SEMICONDUCTOR DEVICE

BACKGROUND OF THE INVENTION

1. Field of the Invention

The present invention relates to a method for fabricating a semiconductor memory device, and more particularly, to a method for forming a capacitor of a semiconductor device that prevents characteristic of a device from being deteriorated due to residue resulting from a process step of defining a storage node.

2. Background of the Related Art

Generally, in a process for fabricating a DRAM capacitor based on an electrochemical deposition (ECD) Pt process, a SiON film is deposited on a dummy pattern layer to improve a profile of a dummy pattern for defining a storage node.

The SiON film acts as an etching barrier film to facilitate a vertical profile of the dummy pattern. To remove the dummy pattern formed after the ECD Pt process, the SiON film is removed by a dry etching process.

A related art method for forming a capacitor of a semiconductor device will be described with reference to the accompanying drawings.

FIGS. 1A to 1E are sectional views illustrating related art process steps of forming a capacitor of a semiconductor device. FIG. 2A is a photograph showing a storage node after etch-back of an etching barrier film, and FIG. 2B is a photograph showing a storage node after wet deep-out of a dummy pattern.

As shown in FIG. 1A, an insulating film 11 and a surface anti-reflecting film 12 are sequentially formed on a semiconductor substrate (not shown) in which a cell transistor (not shown) is formed. A contact hole is formed to connect a capacitor with one electrode of the cell transistor.

A doped polysilicon layer is deposited within the contact hole by a chemical vapor deposition (CVD) process. The doped polysilicon layer is then etched back to form a recess portion, so that a plug layer 13 is formed. A low resistance contact film 14 and a barrier film 15 are formed in the recess portion so as to reduce contact resistance between the plug layer 13 and the barrier film 15 which will be formed later.

The low resistance contact film 14 is formed in such a manner that a material such as Ti is deposited on a silicon (Si) and annealed to form TiSix, and some of Ti which is not reacted with Si is removed.

The barrier film 15 is formed on an entire surface including a portion where the low resistance contact film 14 is formed. The barrier film 15 is then flattened to remain on the low resistance contact film 14.

Subsequently, Pt is deposited on the entire surface to form a first metal layer 16 used as a seed layer.

As shown in FIG. 1B, a dummy pattern 17 for patterning of a storage node and an etching barrier film 18 are formed on the entire surface. SiON is used as the etching barrier film 18.

As shown in FIG. 1C, the dummy pattern 17 and the etching barrier film 18 are selectively etched by a photolithography process to define a lower electrode formation region 19.

As shown in FIG. 1D, a second metal layer 20 is formed using the first metal layer 16 exposed in the storage node formation region, i.e., in a portion where the dummy pattern 17 is removed, as a seed layer. The second metal layer 20 is formed by the ECD process.

As shown in FIG. 1E, the etching barrier film 18 is removed by a dry etching process and the dummy pattern 17 is removed by a wet deep-out process.

However, in the related art process as above, when SiON used as the etching barrier film 18 is dry etched, blanket etching is performed without using a photo mask. At this time, since a dry etching gas acts on an upper surface of a lower electrode of Pt, residue containing Pt is generated.

Such residue remains even after the wet deep-out of the dummy pattern. In this case, electrical characteristic of the device may be deteriorated. Photographs showing such residue are shown in FIGS. 2A and 2B. Referring to FIG. 2B, a large quantity of the residue generated during etch-back process of the etching barrier film remains.

However, the related art method for forming a capacitor of a semiconductor device has several problems.

When removing the etching barrier film used to obtain a vertical profile of the dummy pattern for defining the storage node, residue is generated. The residue remains even after the dummy pattern is removed, thereby deteriorating electrical characteristic of the device. Particularly, unevenness occurs when a BST dielectric layer is deposited. For this reason, capacitance between cells becomes uneven and loss of current partially occurs.

SUMMARY OF THE INVENTION

Accordingly, the present invention is directed to a method for forming a capacitor of a semiconductor device that substantially obviates one or more of the problems due to limitations and disadvantages of the related art.

An object of the present invention is to provide a method for forming a capacitor of a semiconductor device that prevents characteristic of a device from being deteriorated due to residue resulting from a process step of defining a storage node.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve these and other advantages and in accordance with the purpose of the present invention, as embodied and broadly described, a method for forming a capacitor of a semiconductor device includes the steps of forming an insulating film having a contact hole on a substrate, forming a conductive layer within the contact hole, forming a first metal layer on an entire surface including the conductive layer, forming a dummy pattern and an etching barrier film on the first metal layer, selectively etching the dummy pattern and the etching barrier film to form a lower electrode formation region, forming a second metal layer in the lower electrode formation region using the first metal layer as a seed layer, removing the etching barrier film and the dummy pattern and performing a wet cleaning process to remove residue resulting from removing the etching barrier film and the dummy pattern, and removing the exposed first metal layer to form a lower electrode.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

In the present invention, it is intended that residue resulting from a process of forming a storage node is removed by a wet cleaning process and then later processes are performed. In the wet cleaning process, a cleaning solution that can react with residue containing a component of a lower electrode formation material layer to remove the residue is used.

The process steps of forming a capacitor of a semiconductor device according to the present invention will be described with reference to FIGS. 3A to 3H.

Figure 1A:
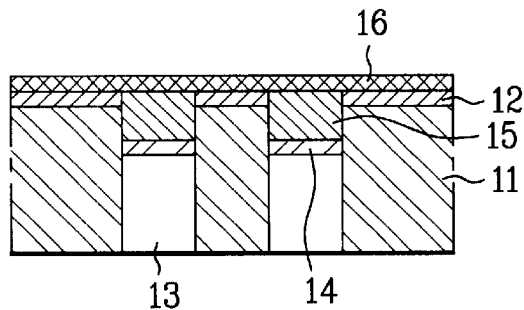
FIGS. 1A to 1E are sectional views illustrating related art process steps of forming a capacitor of a semiconductor device.
Figure 1B:
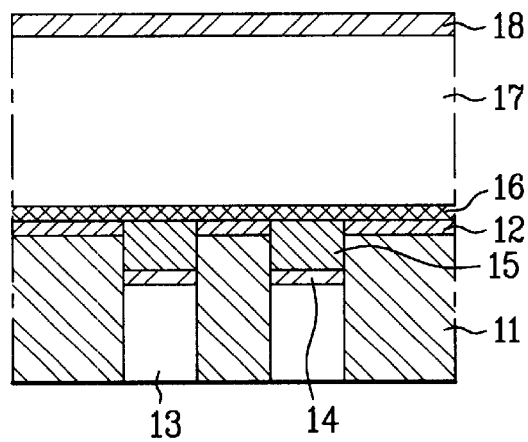
Figure 1C:
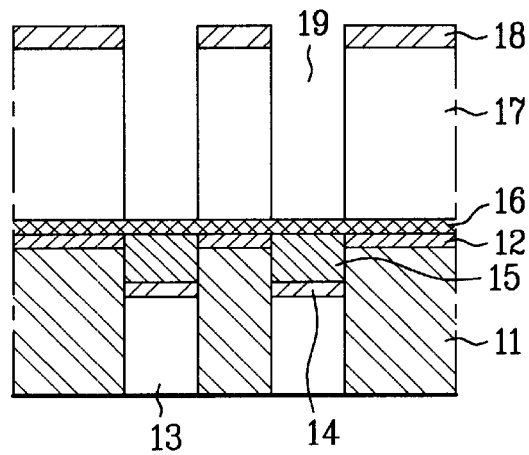
Figure 1D:
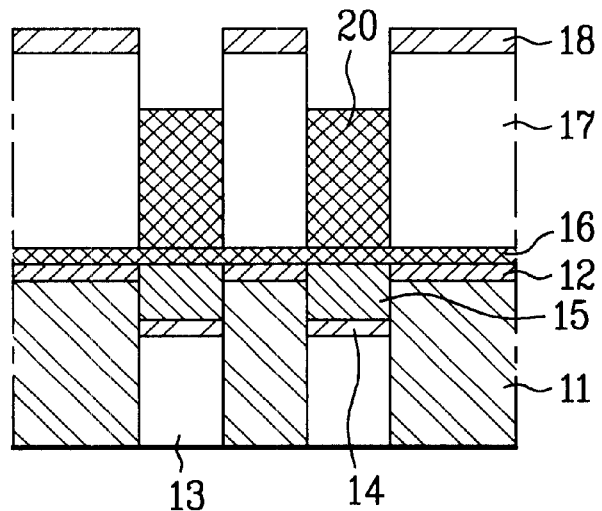
Figure 1E:
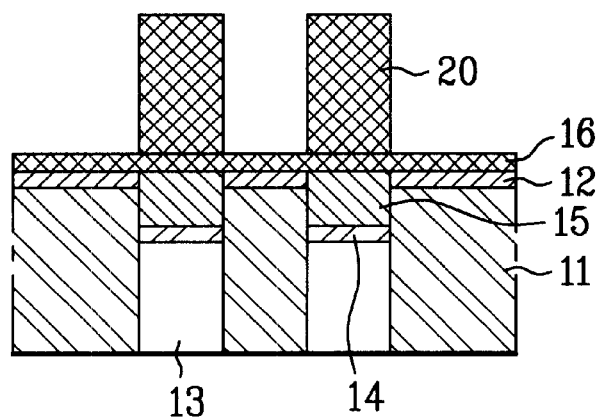
Figure 2A:
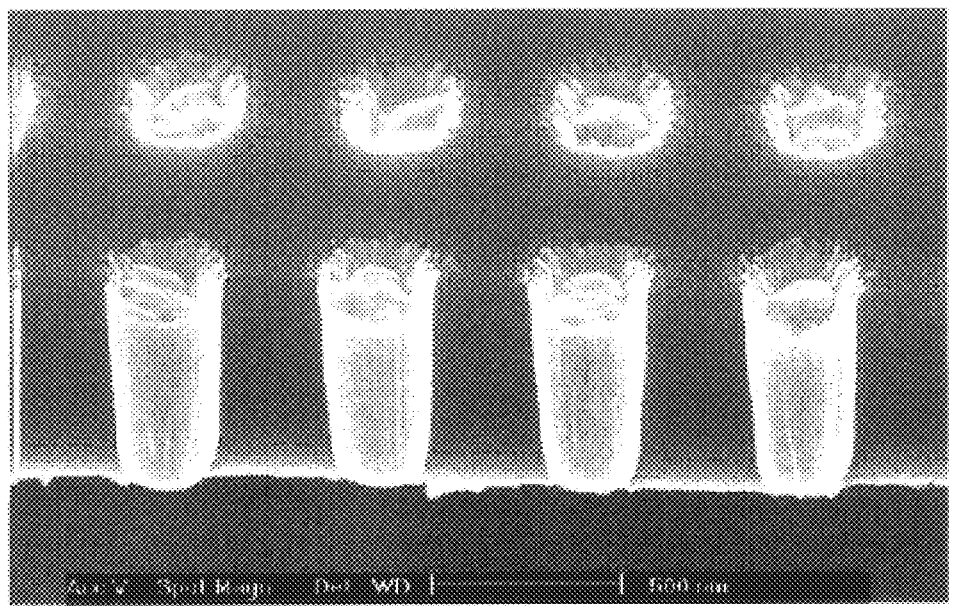
FIG. 2A is a photograph showing a storage node after etch-back of an etching barrier film.
Figure 2B:
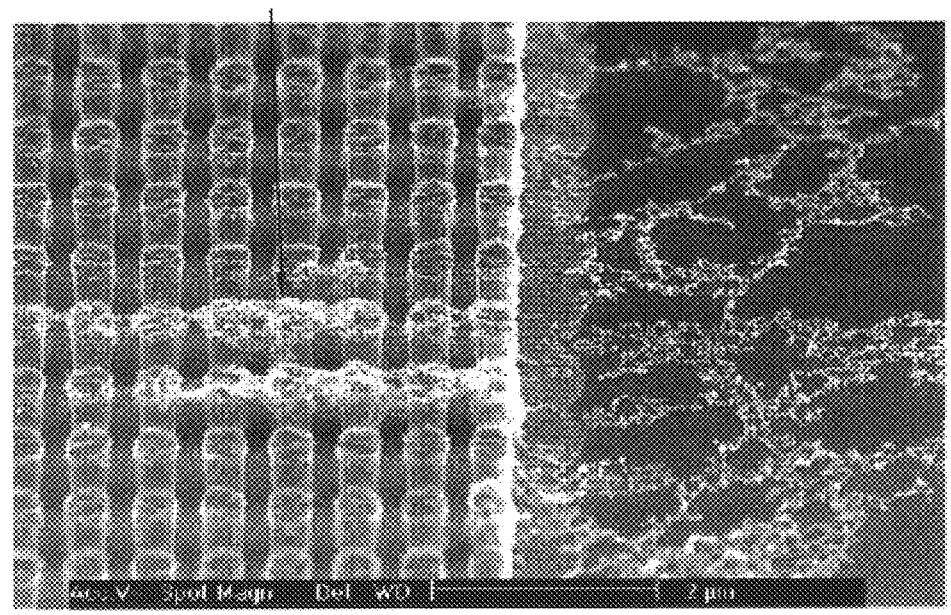
FIG. 2B is a photograph showing a storage node after wet deep-out of a dummy pattern.
Figure 3A:
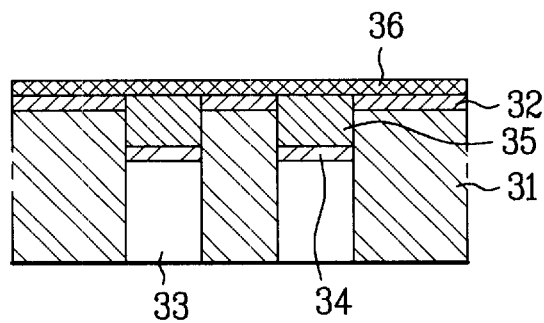
FIGS. 3A to 3H are sectional views of process steps of forming a capacitor of a semiconductor device according to the present invention.

As shown in FIG. 3A, an insulating film 13 and a surface anti-reflecting film 32 are sequentially formed on a semiconductor substrate (not shown) in which a cell transistor (not shown) is formed. A contact hole is formed to connect a capacitor with one electrode of the cell transistor. The insulating film 31 is formed of an oxide film while the surface anti-reflecting film 32 is formed of a material having high etching selectivity, such as a nitride film, at a thickness of 300~1000 Å. A conductive layer is formed within the contact hole.

The process for forming the conductive layer within the contact hole will be described below.

First, a doped polysilicon layer is deposited within the contact hole by a CVD process. The doped polysilicon layer is then etched back to form a recess portion, so that a plug layer 33 is formed. The recess portion has a depth of 500~1500 Å.

Subsequently, a low resistance contact film 34 and a barrier film 35 are formed in the recess portion so as to reduce contact resistance between the plug layer 33 and the barrier film 35 which will be formed later.

The low resistance contact film 34 is formed in such a manner that a material such as Ti is deposited on Si at a thickness of 100~300 Å and annealed by a rapid thermal process (RTP) to form TiSix, and some of Ti which is not reacted with Si is removed.

The barrier film 35 is formed in such a manner that any one of TiN, a three-component based diffusion barrier film, e.g., TiSiN, TiAlN, TaSiN, or TaAlN is deposited on the entire surface including the low resistance contact film 34 by a physical vapor deposition (PVD) or CVD process and then flattened by a chemical mechanical polishing (CMP) process to remain on the low resistance contact film 34.

Subsequently, Pt is deposited on the entire surface at a thickness of 50~100 Å to form a first metal layer 36 used as a seed layer. Any one of Ru, Ir, Os, W, Mo, Co, Ni, Au, and Ag with excellent etching characteristic may be used as the first metal layer 36.

Figure 3B:
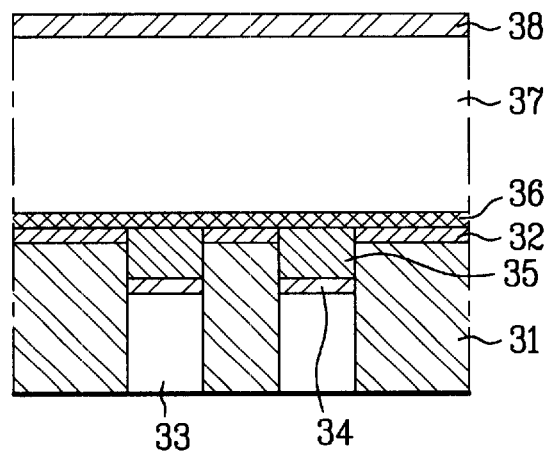

As shown in FIG. 3B, a dummy pattern 37 for patterning of a storage node and an etching barrier film 38 are formed on the entire surface. A material having high etching selectivity is used as the dummy pattern 37 and the etching barrier film 38.

Figure 3C:
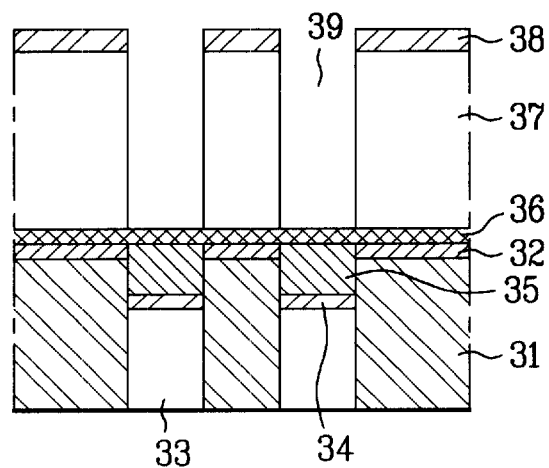

Preferably, the dummy pattern 37 is formed of a photoresist or a CVD oxide film at a thickness of 5000~10000 Å and the etching barrier film 38 is formed of SiON at a thickness of 100~1000 Å. The dummy pattern 37 and the etching barrier film 38 are selectively etched to form a lower electrode formation region 39 as shown in FIG. 3C.

Figure 3D:
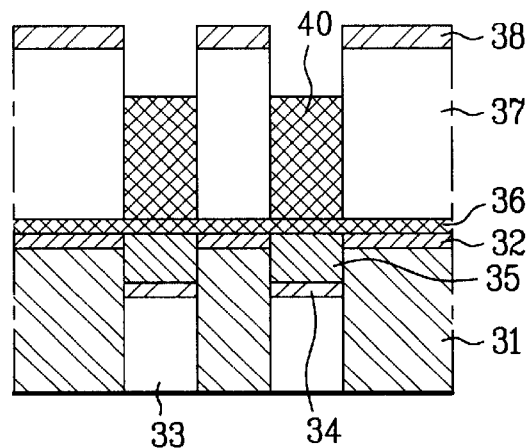

Subsequently, as shown in FIG. 3D, after a pre-cleaning process for deposition of Pt by the ECD process is performed, a second metal layer 40 is formed using the first metal layer 36 exposed in the storage node formation region 39, i.e., in a portion where the dummy pattern 37 is removed, as a seed layer. The second metal layer 40 is formed by the ECD process.

Current density during the ECD process is within the range of 0.1~10 mA/cm$^2$, and DC power, pulse power or reverse pulse power is used. The second metal layer 40 is formed in the lower electrode formation region 39 at a height lower than an upper surface of the dummy pattern 37.

Figure 3E:
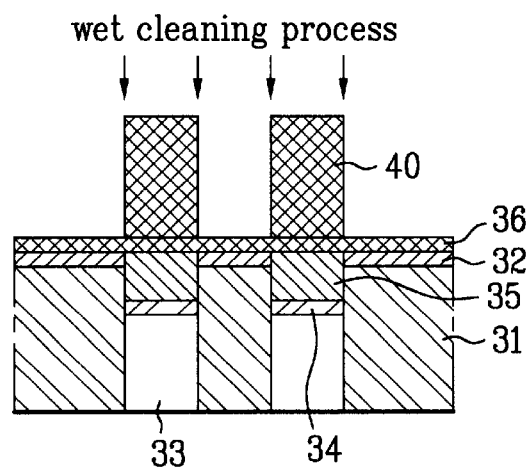

As shown in FIG. 3E, the etching barrier film 38 on the dummy pattern 37 is removed by a dry etching process and the dummy pattern 37 is removed by a wet deep-out process. A mixing solution of HF or HF/NH$_4$F is used in the wet deep-out process. Residue is generated in the process for removing the etching barrier film 38. The residue is removed by the following processes.

In the process for removing the etching barrier film 38, a large quantity of residue containing a component of the second metal layer 40 is generated. The wet cleaning process is performed using a cleaning solution that can react with the residue to remove it.

Preferably, the wet cleaning process is performed in such a manner that a mixing ratio of $H_2SO_4:H_2O_2$ is maintained at 1:0.1~1:100, a processing temperature is 4~100° C. and dipping time is 2~3600 sec. More preferably, the wet cleaning process is performed for five minutes at a mixing ratio of 4:1.

In addition to $H_2SO_4:H_2O_2$, diluted $H_2SO_4$, a mixing solution of $NH_4OH/H_2O_2/H_2O$, a mixing solution of $HF/H_2O$, and a mixing solution of $HF/HN_4F$ may be used solely or by sequentially combining them.

Figure 3F:
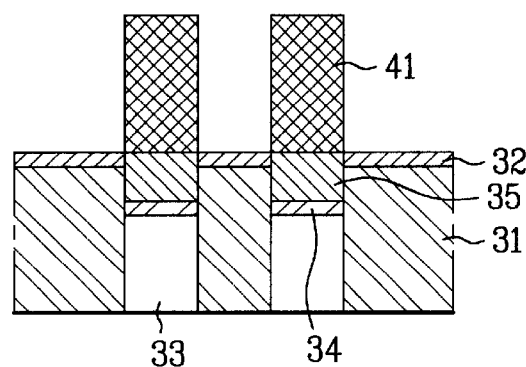

Subsequently, as shown in FIG. 3F, the first metal layer 36 is removed by the dry etch-back process to form a lower electrode 41.

Figure 3G:
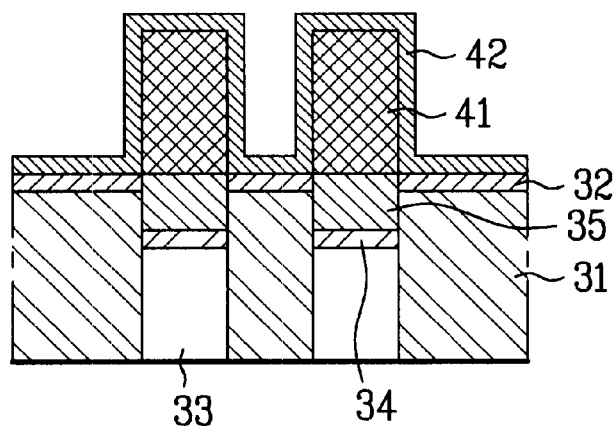

As shown in FIG. 3G, a high dielectric material, e.g., BST is deposited on the entire surface at a thickness of 150~500 Å within the range of a temperature between 400° C. and 600° C. by the CVD process, so that a dielectric layer 42 is formed.

Subsequently, the dielectric layer 42 is crystallized by the RTP process for 30~180 sec under the ambient of N between 500° C. and 700° C., thereby improving dielectric characteristic.

Figure 3H:
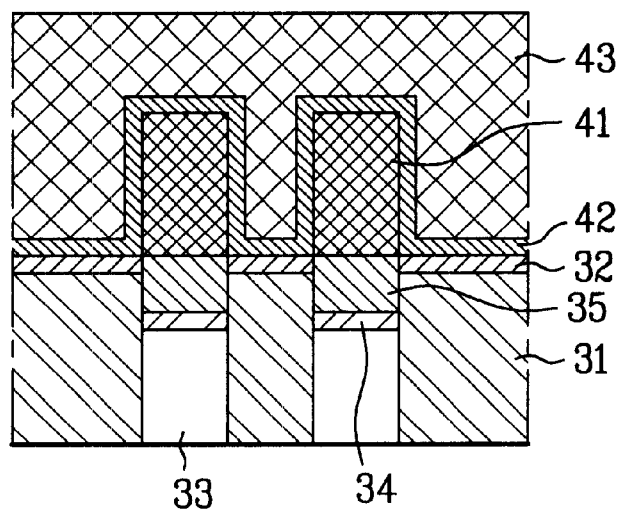

As shown in FIG. 3H, Pt is deposited on the dielectric layer 42 by the CVD process and then selectively patterned to form a capacitor upper electrode 43.

Figure 4:
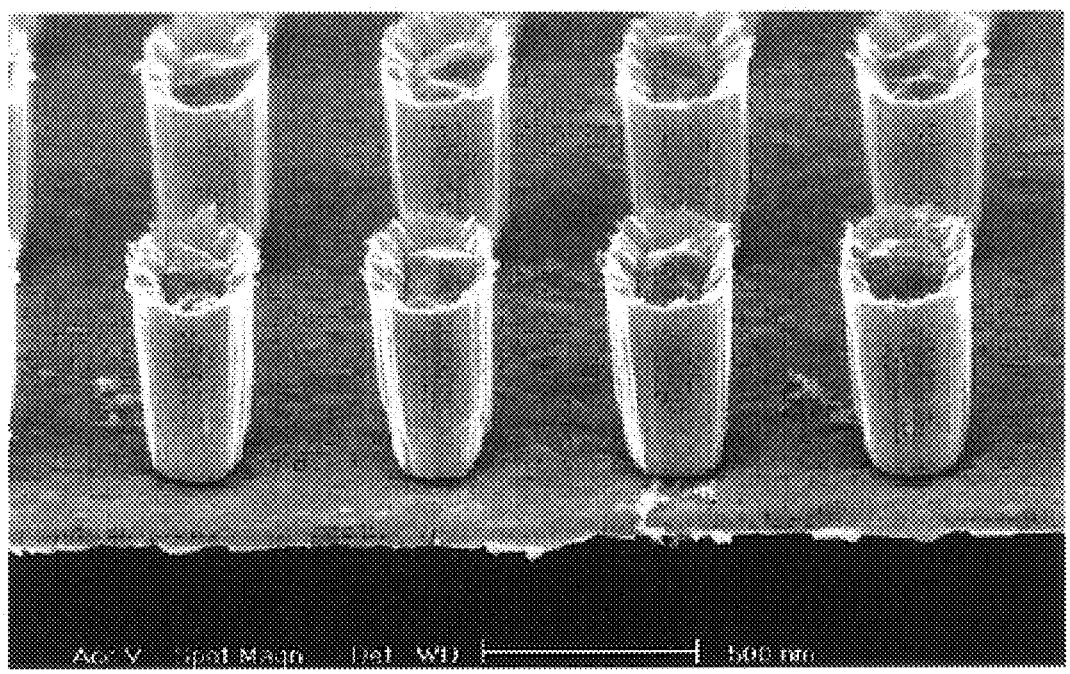
FIG. 4 is photograp[0088] showin a storage node after removing residue using a wet cleaning process according to the present invention.

In the process for forming a capacitor of a semiconductor device according to the present invention, after the residue generated when removing the etching barrier film used to obtain the vertical profile of the dummy pattern for defining the storage node is completely removed as shown in FIG. 4, later processes are formed, thereby improving characteristic of the device.

The method for forming a capacitor of a semiconductor device according to the present invention has the following advantages.

It is possible to completely remove the residue generated when removing the etching barrier film used to obtain the vertical profile of the dummy pattern for defining the storage node. In this case, in a later process, the BST dielectric layer can uniformly be deposited and uniform capacitance between cells can be obtained. Also, partially generated loss of current can be reduced, thereby improving electrical characteristic. Particularly, since a high stacked Pt storage node can be formed even in a device of 0.1 µm or less, characteristic of the capacitor that uses BST as a dielectric film can be improved.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications and variations will be apparent to those skilled in the art. In the claims, means-plus-function clauses are intended to cover the structures described herein as performing the recited function and not only structural equivalents but also equivalent structures.

What is claimed is:

1. A method for forming a capacitor of a semiconductor device comprising the steps of:
    forming an insulating film having a contact hole o[008e] a substrate;
    forming a conductive layer within the contact hole;
    forming a first metal layer on an entire surface including the conductive layer;
    forming a dummy pattern and an etching barrier film on the first, metal layer;
    selectively etching the dummy pattern and the etching barrier film to form a lower electrode formation region;
    forming a second metal layer in the lower electrode formation region using the first metal layer as a seed layer;
    removing the etching barrier film and the dummy pattern and performing a wet cleaning process to remove residue resulting from removing the etching barrier film and the dummy pattern; and
    removing the exposed first metal layer to form a lower electrode.

2. The method of claim 1, wherein the lower electrode formation region partially overlaps the conductive layer.

3. The method of claim 1, wherein a cleaning solution that can react with the residue containing a component of the second metal layer to remove the residue is used in the wet cleaning process.

4. The method of claim 3, wherein the wet cleaning process is performed in such a manner that a mixing ratio of $H_2SO_4:H_2O_2$ is maintained at 1:0.1~1:100, a processing temperature is 4~100° C. and dipping time is 2~360 sec.

5. The method of claim 3, wherein the wet cleaning process is performed in such a manner that diluted $H_2SO_4$, a mixing solution of $NH_4OH/H_2O_2/H_2O$, a mixing solution of $HF/H_2O$, and a mixing solution of $HF/HN_4F$ is used solely or by sequentially combining them.

6. The method of claim 1, wherein the etching barrier film is removed by a dry etching process and the dummy pattern is removed by a wet deep-out process.

7. The method of claim 6, wherein the wet deep-out process is performed using a mixing solution of HF or $HF/NH_4F$.

8. The method of claim 1, wherein the conductive layer is formed by sequentially depositing a plug layer, a low resistance contact layer, and a barrier layer.

9. The method of claim 1, further comprising the step of forming a surface anti-reflecting film on a surface of the insulating film other than the contact hole, using a material having high etching selectivity.

10. The method of claim 1, wherein the first metal layer is formed at a thickness of 50~1000 Å using any one of Pt, Ru, Ir, Os, W, Mo, Co, Ni, Au and Ag.

11. The method of claim 1, wherein the dummy pattern is formed of a photoresist or a CVD oxide film.

12. The method of claim 1, wherein the second metal layer is formed by an ECD process in which current density is within the range of 0.1~10 mA/cm$^2$, and DC power, pulse power or reverse pulse power is used.

13. A method for forming a capacitor of a semiconductor device comprising the steps of:
    sequentially forming an insulating film and a surface anti-reflecting film on an entire surface including a cell transistor;
    sequentially forming a plug layer, a low resistance contact layer, and a barrier layer within the contact hole;
    depositing Pt on the entire surface to form a first metal layer used as a seed layer;
    forming a dummy pattern and an etching barrier film on the entire surface and selectively etching them to form a lower electrode formation region;
    forming a second metal layer using the exposed first metal layer as a seed layer by an ECD process;
    removing the etching barrier film and the dummy pattern and performing a wet cleaning process using a solution that can react with residue containing a component of the second metal layer to remove the residue;
    removing the exposed firs[009f] meta[008c] layer to form a lower electrode;
    depositing BST on the entire surface to form a dielectric layer;
    depositing Pt on the dielectric layer and selectively patterning Pt to form an upper electrode.

14. The method of claim 13, wherein the plug layer is formed in such a manner that a doped polysilicon layer is deposited within the contact hole by a CVD process and then etched back to have a recess portion of 500~1500 Å at an upper portion of the contact hole.

15. The method of claim 13, wherein the low resistance contact layer is formed in such a manner that Ti is deposited on Si at a thickness of 100~300 Å and annealed to form TiSix, and some of Ti which is not reacted with Si is removed by a wet etching process.

16. The method of claim 13, wherein the barrier film is formed in such a manner that any one of TiN, TiSiN, TiAlN, TaSiN, and TaAlN is deposited on the entire surface by a PVD or CVD process and then flattened to remain on the low resistance contact film by a CMP process.

17. The method of claim 13, wherein the dielectric layer is formed by a CVD process at a thickness of 150~50 Å within the range of a temperature of 400~600° C.

18. The method of claim 13, wherein the dielectric layer is crystallized by an RTP process for 30~180 sec under the ambient of N between 500° C. and 700° C.

19. The method of claim 13, wherein the wet cleaning process is performed in such a manner that a mixing ratio of $H_2SO_4:H_2O_2$ is maintained at 1:0.1~1:100, a processing temperature is 4~100° C. and dipping time is 2~3600 sec.

20. The method of claim 13, wherein the wet cleaning process is performed in such a manner that diluted $H_2SO_4$, a mixing solution of $NH_4OH/H_2O_2/H_2O$, a mixing solution of $HF/H_2O$, and a mixing solution of $HF/HN_4F$ is used solely or by sequentially combining them.

* * * * *